(12) United States Patent
Yu et al.

(10) Patent No.: US 8,119,938 B2
(45) Date of Patent: Feb. 21, 2012

(54) TOUCH KEYPAD ASSEMBLY

(75) Inventors: Hsin-Hsien Yu, Tu-cheng (TW);
 Yao-Pang Lu, Tu-Cheng (TW);
 Chao-Chang Li, Tu-cheng (TW)

(73) Assignee: Hon Hai Precision Inc. Co., Ltd., New Taipei (TW)

( * ) Notice: Subject to any disclaimer, the term of this patent is extended or adjusted under 35 U.S.C. 154(b) by 387 days.

(21) Appl. No.: 12/384,227

(22) Filed: Apr. 2, 2009

(65) Prior Publication Data
 US 2009/0250329 A1 Oct. 8, 2009

(30) Foreign Application Priority Data
 Apr. 2, 2008 (CN) .................. 2008 2 0034911 U

(51) Int. Cl.
 *H01H 13/83* (2006.01)
(52) U.S. Cl. .......... 200/5 A; 200/516; 200/314; 200/317
(58) Field of Classification Search .............. 200/5 A, 200/600, 512, 516, 341, 310–317; 345/168–170, 345/173, 176; 341/22, 33, 34; 708/146; 379/433.07, 368, 433.06; 455/550.1
 See application file for complete search history.

(56) References Cited

U.S. PATENT DOCUMENTS

| 5,917,906 | A | * | 6/1999 | Thornton | 379/433.07 |
| 6,824,321 | B2 | | 11/2004 | Ward et al. | |
| 6,924,789 | B2 | * | 8/2005 | Bick | 345/168 |
| 7,119,296 | B1 | | 10/2006 | Liu et al. | |
| 7,279,647 | B2 | * | 10/2007 | Philipp | 200/5 R |
| 7,444,163 | B2 | * | 10/2008 | Ban et al. | 455/550.1 |
| 7,656,314 | B2 | * | 2/2010 | Muranaka et al. | 341/22 |
| 7,829,812 | B2 | * | 11/2010 | Tolbert et al. | 200/600 |
| 7,903,002 | B2 | * | 3/2011 | Olsson et al. | 341/22 |
| 7,935,904 | B2 | * | 5/2011 | Song | 200/310 |
| 2008/0094373 | A1 | | 4/2008 | Song | |

* cited by examiner

*Primary Examiner* — Michael Friedhofer
(74) *Attorney, Agent, or Firm* — Wei Te Chung; Andrew C. Cheng; Ming Chieh Chang

(57) ABSTRACT

A touch keypad assembly (100) includes a main board (10), a metal dome (40) disposed on a predetermined position of the main board, a touchpad layer (30) disposed on the metal dome, a keypad cover (20) disposed over the touchpad layer, and a light guide film (60) disposed between the metal dome and the keypad cover. The touchpad layer is a flexible printed circuit board.

9 Claims, 3 Drawing Sheets

TOUCH KEYPAD ASSEMBLY

BACKGROUND OF THE INVENTION

1. Field of the Invention

The present invention relates generally to keypad assembly used in electronic devices such as mobile phones, hand held device, or the like, and more particularly to keypad assembly for selectively operating in a mechanical metal dome mode or a capacitive touchpad mode.

2. Description of Related Art

Portable electronic devices, such as mobile phones, hand held device, or the like, include a keypad assembly having one or more keys as a data input unit. A user conveniently inputs alphanumeric or symbol characters and selects a desired function using the keypad assembly.

A conventional structure for a mechanical metal dome mode of the keypad assembly is constructed as follows: one or more metal domes are attached at predetermined contact points on a printed circuit board, a silicon keypad rubber with a predetermined thickness, on which corresponding responding protrusions are formed, is stacked on the printed circuit board, and a keypad buttons are attached on the silicon keypad rubber. In recent years, a structure for a touchpad mode is constructed as follows: films having corresponding electrodes cross each other on the printed circuit board to form a coordinate system, and a dielectric layer is interposed between the films. Accordingly, when a user touches the keypad assembly, capacitance at the touched position is changed, such that corresponding data are input by detecting the capacitance change.

Recently, a new keypad assembly for allowing the selection of the mechanical metal dome mode or the touch mode is instructed. It is configured by stacking the structure for the touch mode on the structure for the mechanical metal dome mode. Obviously, the whole thickness of such a stacked structure is increased and same to the whole volume of the electronic device.

Therefore, a keypad assembly having a reduced volume is desired.

BRIEF SUMMARY OF THE INVENTION

Accordingly, an object of the present invention is to provide a keypad assembly having a reduced volume.

In order to achieve the object set forth, a touch keypad assembly includes a main board, a metal dome disposed on a predetermined position of the main board, a touchpad layer disposed on the metal dome, a keypad cover disposed over the touchpad layer, and a light guide film disposed between the metal dome and the keypad cover. The touchpad layer is a flexible printed circuit board.

Other objects, advantages and novel features of the invention will become more apparent from the following detailed description of the present embodiment when taken in conjunction with the accompanying drawings.

BRIEF DESCRIPTION OF THE DRAWINGS

The foregoing summary, as well as the following detailed description of the preferred embodiments of the present invention, will be better understood when read in conjunction with the appended drawings. For the purpose of illustrating the invention, there is shown in the drawings, embodiments which are presently preferred. It should be understood, however, that the present invention is not limited to the precise arrangements and instrumentality shown in the attached drawings.

DETAILED DESCRIPTION OF THE PREFERRED EMBODIMENT

Figure 1:
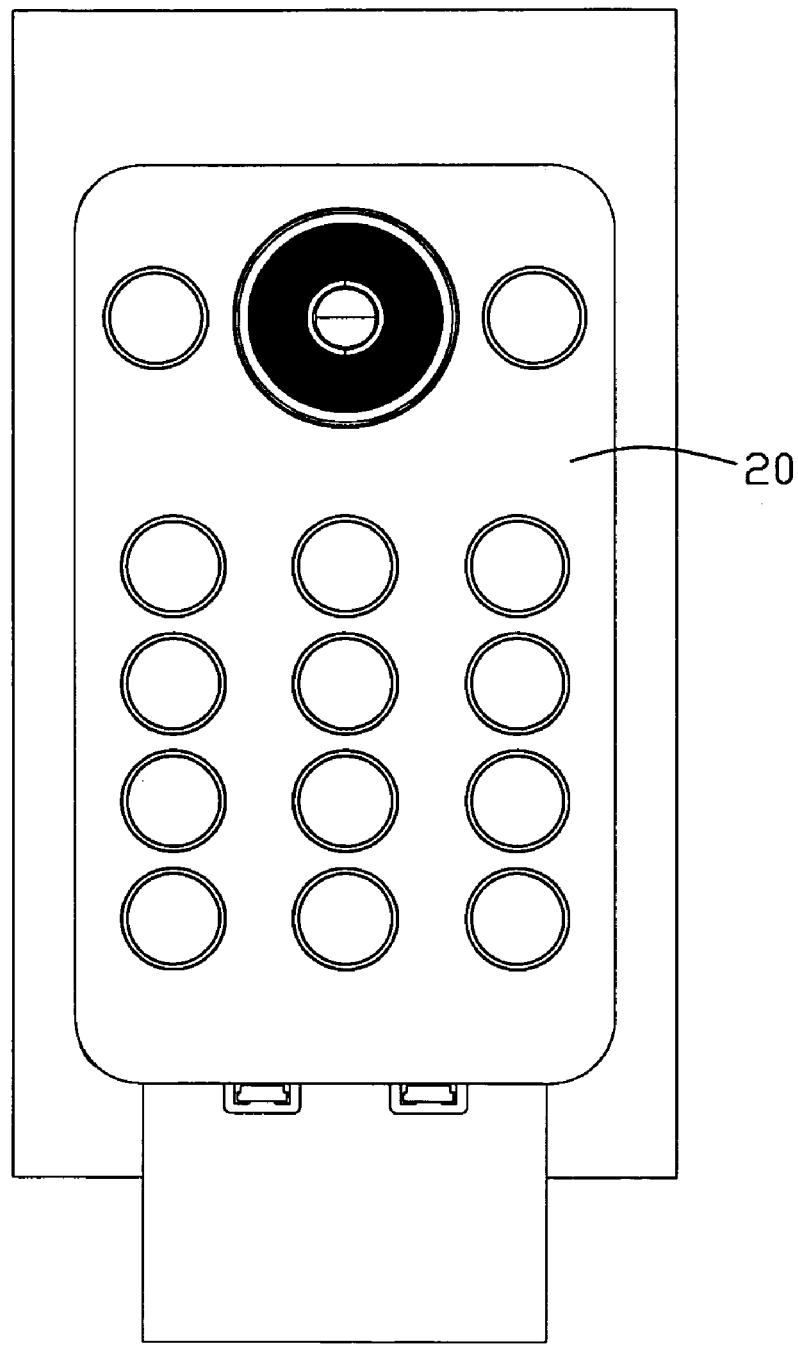
FIG. 1 is a top plan view of a touch keypad assembly in accordance with the present invention.

Reference will now be made to the drawing figures to describe the present invention in detail.

Figure 2:
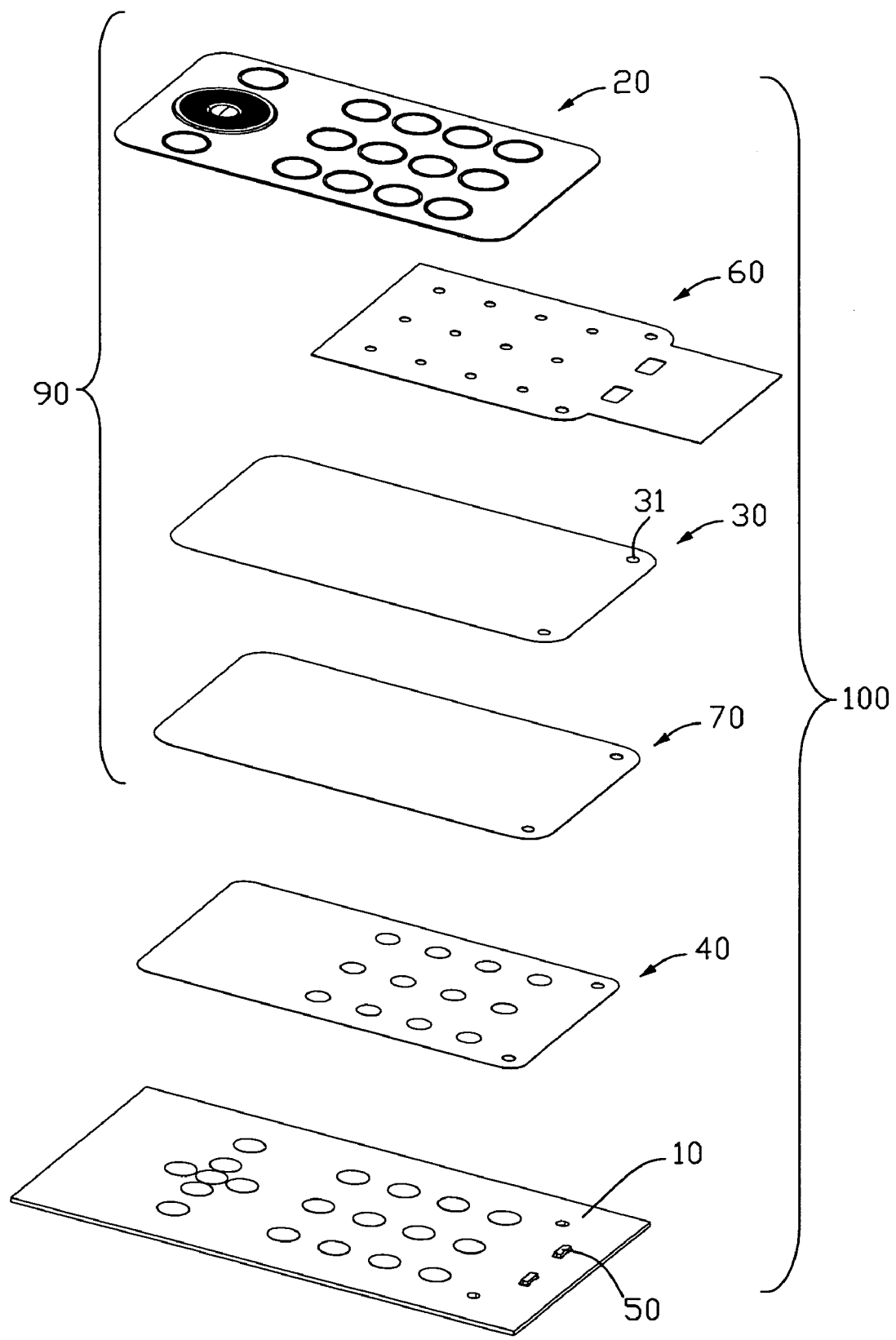
FIG. 2 is an exploded, perspective view of the touch keypad assembly shown in FIG. 1.
Figure 3:
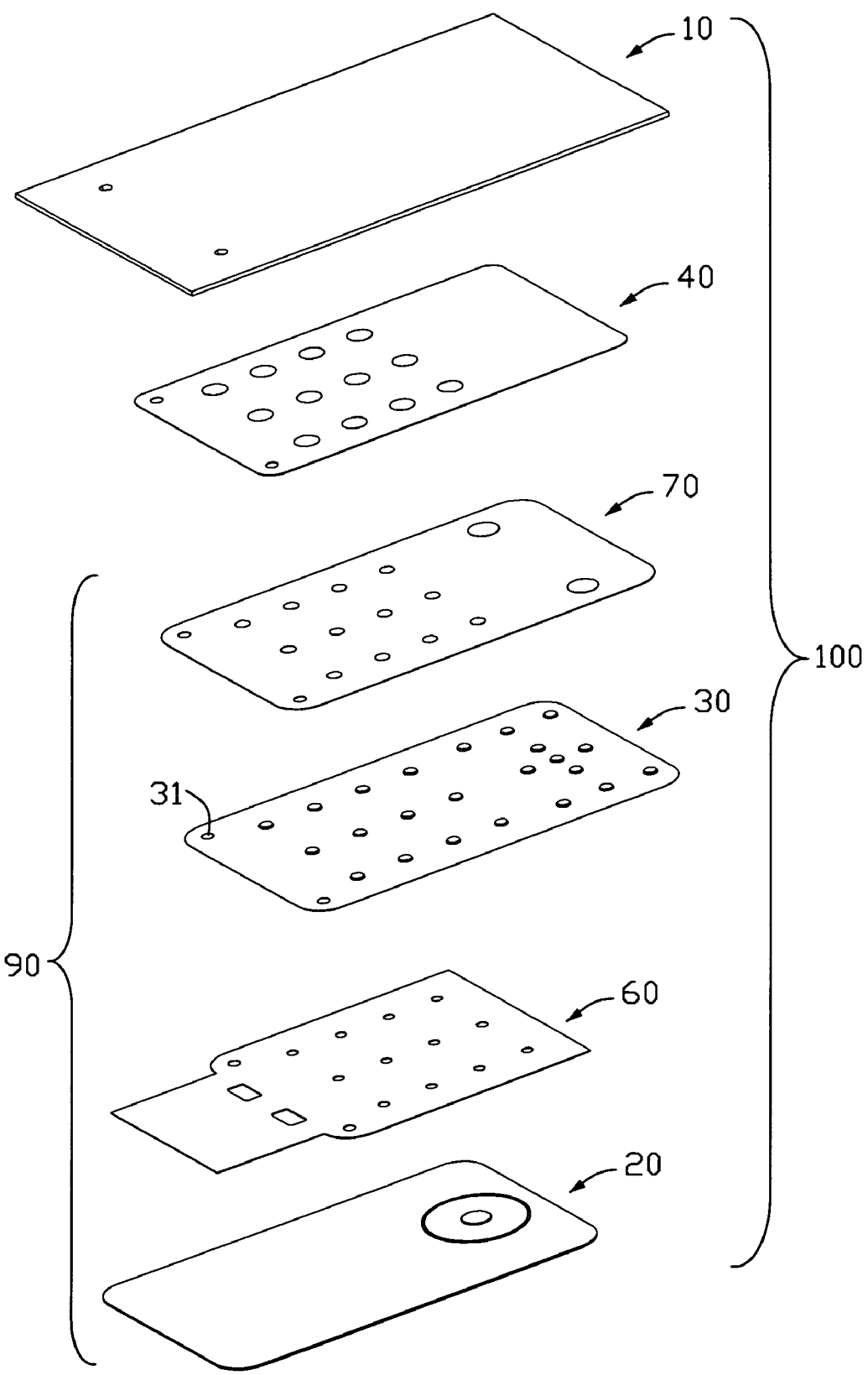
FIG. 3 is a view similar to FIG. 2 while from another aspect.

Referring to FIGS. 1-3, a touch keypad assembly 100 according to the present invention will be applied to a mobile terminal herein, and can be properly applied to an electronic device (not shown) having a housing and a data input unit assembled with the housing.

The touch keypad assembly 100 of the data input unit comprises a main board 10, a metal dome 40 and a keypad 90 disposed over the metal dome 40 for applying or registering a force thereon. The metal dome 40 is assembled on a predetermined position of the main board 10. In the present embodiment, the keypad 90 includes a rubber layer 70 disposed above the metal dome 40, a touchpad layer 30 disposed above the rubber layer 70, a light guide film (LGF) 60 disposed above the touchpad layer 30, and a keypad cover 20 on which a plurality of keys (not labeled) stamped thereon. As can be understood, the keypad cover 20 can be also formed by other known technologies. In the preferred embodiment, Light Emitting Diodes (LED) 50 are employed and located on the main board 10. The LED 50 is used as a light source for providing light when the electronic device is used in a dark circumstance. Other light source can also be used according to different design requirements. However, when the light source 50 is assembled on the main board 10, the material of the keypad 90 should be capable of passing the light therethrough. In the present embodiment, the touchpad layer 30 is made from transparent material or semi-transparent material.

In the preferred embodiment, the touchpad layer 30 is a flexible printed circuit board which is applied not only to registered an external pressure but to subject to a touch. In such an arrangement, the user can select either mechanical metal dome mode or touch mode at his convenience.

It should noted that the rubber layer 70 is optionally selected, and in the preferred embodiment, the rubber layer 70 should be made from transparent material.

In an alternative embodiment, the touchpad layer 30 can be positioned above the LGF 60 and defines thereon a plurality of holes 31 from which the light of LED 50 can be sent to the keypad cover 20 through the LGF 60.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

We claim:

1. A touch keypad assembly, comprising:
   a main board;
   a metal dome disposed on a predetermined position of the main board; and a keypad disposed over the metal dome for applying a force on the metal dome and being used as a touchpad according to a mode selection;

wherein the keypad comprises a touchpad layer disposed on the metal dome, a keypad cover disposed over the touchpad layer, and a light guide film disposed between the metal dome and the keypad cover; wherein the light guide film is disposed over the touchpad layer.

2. The touch keypad assembly as claimed in claim 1, wherein the touchpad layer is formed of a flexible printed circuit board.

3. The touch keypad assembly as claimed in claim 2, wherein the light guide film is disposed over the metal dome.

4. The touch keypad assembly as claimed in claim 3, wherein the touchpad layer defines a plurality of holes therethrough.

5. The touch keypad assembly as claimed in claim 1, further comprising a keypad layer, which is formed from transparent material, disposed between the touchpad layer and the metal dome.

6. The touch keypad assembly as claimed in claim 1, further comprising at least one LED (Light Emitting Diode) attached on the main board to provide light to the keypad cover.

7. The touch keypad assembly as claimed in claim 1, further comprising a light source attached thereto.

8. An electronic device, comprising:

a housing;

a touch keypad assembly disposed in the housing, the touch keypad assembly comprising:

a main board;

a metal dome disposed on a predetermined position on the main board; and a touchpad layer disposed over the metal dome for applying a force on the metal dome;

a keypad cover disposed over the touchpad layer; and a light guide film disposed between the touchpad layer and the keypad cover.

9. A touch keypad assembly, comprising:

a main board;

a metal dome disposed on a predetermined position of the main board; and a keypad disposed over the metal dome for applying a force on the metal dome and being used as a touchpad according to a mode selection; wherein the keypad comprises a touchpad layer disposed on the metal dome, a keypad cover disposed over the touchpad layer, and a light guide film disposed between the metal dome and the touchpad layer; wherein said touchpad layer defines a plurality of through holes to allow light from the light guide film to pass toward the keypad cover.

\* \* \* \* \*